(12) United States Patent
Yonezawa et al.

(10) Patent No.: US 9,305,665 B2
(45) Date of Patent: Apr. 5, 2016

(54) MEMORY SYSTEM AND METHOD OF CONTROLLING MEMORY SYSTEM

(71) Applicant: Kabushiki Kaisha Toshiba, Minato-ku (JP)

(72) Inventors: Shinji Yonezawa, Machida (JP); Norio Aoyama, Machida (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 62 days.

(21) Appl. No.: 14/452,930

(22) Filed: Aug. 6, 2014

(65) Prior Publication Data

US 2015/0277793 A1   Oct. 1, 2015

Related U.S. Application Data

(60) Provisional application No. 61/972,909, filed on Mar. 31, 2014.

(51) Int. Cl.
*G11C 29/52* (2006.01)
*G06F 12/00* (2006.01)
*G06F 11/10* (2006.01)

(52) U.S. Cl.
CPC ............ *G11C 29/52* (2013.01); *G06F 11/1008* (2013.01); *G06F 12/00* (2013.01)

(58) Field of Classification Search
CPC ............ G11C 2029/0411; G11C 29/52; G06F 11/1008; G06F 12/0246; G06F 2212/7201; G06F 2212/7205; G06F 11/1068; G06F 2212/72; G06F 11/1016; G06F 12/00
USPC .......................................... 711/103; 714/719
See application file for complete search history.

(56) References Cited

U.S. PATENT DOCUMENTS

| 8,185,687 | B2 | 5/2012 | Matsuyama et al. | |
| 2010/0169553 | A1* | 7/2010 | Yano | G06F 12/0246 711/103 |
| 2011/0185105 | A1* | 7/2011 | Yano | G06F 12/0246 711/103 |
| 2012/0079167 | A1 | 3/2012 | Yao et al. | |
| 2013/0232296 | A1 | 9/2013 | Yonezawa et al. | |
| 2013/0275650 | A1* | 10/2013 | Hida | G06F 12/0246 711/102 |
| 2014/0025864 | A1* | 1/2014 | Zhang | G06F 12/0246 711/103 |
| 2014/0215129 | A1* | 7/2014 | Kuzmin | G06F 12/0246 711/103 |

FOREIGN PATENT DOCUMENTS

| JP | 4745465 | 8/2011 |
| JP | 5066241 | 11/2012 |
| JP | 2013-174972 | 9/2013 |

OTHER PUBLICATIONS

Yang Jan-Ti; Jun-Ming Yu, "Performance comparison of logical-address-to-physical-address algorithms for non-volatile memory," in ASIC, 2003. Proceedings. 5th International Conference on , vol. 1, No., pp. 482-485 vol. 1, Oct. 21-24, 2003.*

(Continued)

*Primary Examiner* — Cynthia Britt
(74) *Attorney, Agent, or Firm* — Oblon, McClelland, Maier & Neustadt, L.L.P.

(57) ABSTRACT

According to one embodiment, when loading of reverse lookup information from a nonvolatile first memory to a randomly accessible second memory has failed, a controller determines whether data at a first physical address is valid or invalid by using lookup information loaded from the first memory to the second memory.

18 Claims, 5 Drawing Sheets

(56) References Cited

OTHER PUBLICATIONS

Leventis, P.; Vest, B.; Hutton, M.; Lewis, D., "MAX II: A low-cost, high-performance LUT-based CPLD," in Custom Integrated Circuits Conference, 2004. Proceedings of the IEEE 2004, vol., No., pp. 443-446, Oct. 3-6, 2004.*

Tabrizi, H.; Agarwal, R., "Predicting bad pages in NAND flash to improve read time: A dynamic programming approach," in Communications (ICC), 2015 IEEE International Conference on, vol., No., pp. 289-294, Jun. 8-12, 2015.*

* cited by examiner

FIG.2

| LOGICAL ADDRESS | NAND ADDRESS |
|---|---|
| ADDRESS N | ADDRESS Y |
| ⋮ | ⋮ |
| ADDRESS M | ADDRESS X |

FIG.3

| NAND ADDRESS | LOGICAL ADDRESS |
|---|---|
| ADDRESS X | ADDRESS M |
| ⋮ | ⋮ |
| ADDRESS Y | ADDRESS N |
| ⋮ | ⋮ |
| ADDRESS Z | ADDRESS M |

MEMORY SYSTEM AND METHOD OF CONTROLLING MEMORY SYSTEM

CROSS-REFERENCE TO RELATED APPLICATIONS

This application is based upon and claims the benefit of priority from U.S. Provisional Patent Application No. 61/972,909, filed on Mar. 31, 2014; the entire contents of which are incorporated herein by reference.

FIELD

Embodiments described herein relate generally to a memory system including a nonvolatile memory and a method of controlling the memory system.

BACKGROUND

In a memory system including a flash memory, when a unit of data erasing (block) and a unit of data read and write are different, according to the progress of rewriting of the flash memory, the blocks are made porous by invalid data (not the latest) data. When the blocks in such a porous state increases, usable blocks decrease and a storage area of the flash memory cannot be effectively used. Therefore, compaction is executed by collecting valid data in a compaction source block and moving the collected data to a compaction destination block, thereby increasing the number of unused blocks.

In the compaction process, it is required to determine whether the data in the compaction source block is valid or invalid. Therefore, a reverse-lookup address translation table (Reverse Lookup Table) is prepared for performing translation from a physical address in the flash memory to a logical address specified by a host. Meanwhile, translation from the logical address to the physical address is performed by using a lookup address translation table (Lookup Table).

BRIEF DESCRIPTION OF THE DRAWINGS

FIG. 2 illustrates a lookup address translation table;

FIG. 3 illustrates a reverse-lookup address translation table;

DETAILED DESCRIPTION

In general, according to one embodiment, a memory system includes a nonvolatile first memory including a plurality of blocks as a unit of data erasing, a randomly accessible second memory, and a controller. The controller performs data transfer between a host device and the first memory via the second memory. In the first memory, a first address translation table and a second address translation table are stored. In the first address translation table, lookup information that associates a logical address specified from the host device with a physical address in the first memory is managed. In the second address translation table, reverse lookup information that associates the physical address in the first memory with the logical address is managed. When loading of the reverse lookup information from the first memory to the second memory has failed, the controller determines whether data at a first physical address is valid or invalid by using the lookup information loaded from the first memory to the second memory.

Exemplary embodiments of a memory system and a method of controlling the same will be explained below in detail with reference to the accompanying drawings. The present invention is not limited to the following embodiments.

First Embodiment

Figure 1:
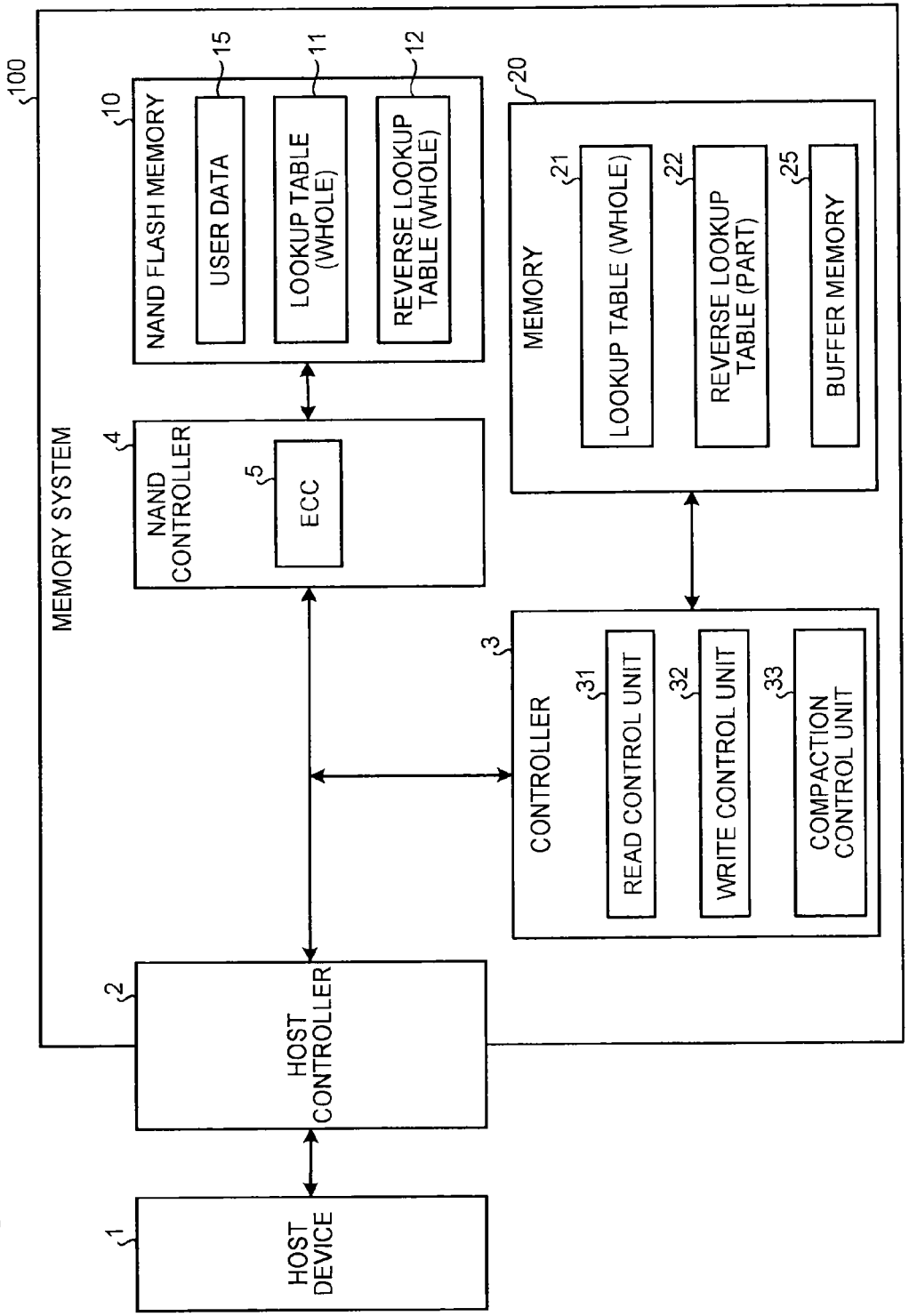
FIG. 1 is a block diagram illustrating a configuration example of a memory system.

FIG. 1 is a block diagram illustrating a configuration example of a memory system 100. The memory system 100 includes a host controller 2, a controller 3, a NAND controller 4, a NAND flash memory 10 (hereinafter, abbreviated as "NAND") as a nonvolatile semiconductor memory, and a memory 20 formed of a RAM or the like. The memory system 100 is connected to a host device (hereinafter, abbreviated as "host") 1 via the host controller 2. The memory system 100 functions as an external storage device of the host 1. The memory system 100 is an SSD (Solid State Drive), for example. The host 1 is a device such as a personal computer, a mobile phone, or an imaging device.

The NAND 10 stores therein user data 15 input from the host 1, and backs up and stores therein a lookup address translation table 11 and a reverse-lookup address translation table 12. The NAND 10 includes one or plural memory chips. Each of the memory chips includes a memory cell array in which a plurality of memory cells is arranged in a matrix. Each of the memory cells is capable of performing multi-valued storage. Each of the memory chips is configured by arranging a plurality of physical blocks, each of the physical blocks being a unit of data erasing. The physical block is formed of a plurality of physical pages. In the NAND 10, data write and data read are performed for each of the physical pages.

The host controller 2 acquires commands such as a read command and a write command from the host 1 via a communication interface such as a SATA (Serial Advanced Technology Attachment) or a SAS (Serial Attached SCSI). An address, data size, data, and the like are attached to the command. When receiving the command from the host 1, the host controller 2 notifies the controller 3 of the command.

The memory 20 can be accessed at a higher speed than the NAND 10. The memory 20 is a randomly access memory. A volatile memory such as an SRAM (Static Random Access Memory) or a DRAM (Dynamic Random Access Memory) is used as the memory 20. The memory 20 includes a memory area as a buffer memory 25 to store data temporarily at the time of writing data from the host 1 in the NAND 10, and a memory area to temporarily store a lookup address translation table (hereinafter, abbreviated as "lookup table") 21 and a reverse-lookup address translation table (hereinafter, abbreviated as "reverse lookup table") 22. At the time of startup of the memory system 100, the lookup table 11 and the reverse lookup table 12 stored in the NAND 10 are loaded to the memory 20 as the lookup table 21 and the reverse lookup table 22. The controller 3 uses these tables 21 and 22, and updates the tables 21 and 22. At a time of power-off sequence or at an appropriate timing during system operation, the tables 21 and 22 are stored in the NAND 10 by the controller 3.

The NAND controller 4 includes, for example, a NAND I/F for performing interface processing with the NAND 10, a DMA controller, and an error correction circuit (ECC circuit)

5. The NAND controller 4 writes data temporarily stored in a buffer memory 25 in the NAND 10, or reads data stored in the NAND 10 and transfers the read data to the buffer memory 25 under control of the controller 3. The ECC circuit 5 performs an encoding process using an error correction code with respect to the write data to the NAND 10, adds an encoding code to the write data, and outputs the write data to the NAND 10. Furthermore, the ECC circuit 5 performs a decoding process using an error correction code with respect to the data read from the NAND 10, and performs error correction of the read data. When there is an error exceeding the correction capability of the ECC circuit 5 in the data read from the NAND 10, a read error occurs.

At the time of requesting the memory system 100 to read or write data, the host 1 transmits a command having a logical address attached thereto to the memory system 100. The logical address is an LBA (Logical Block Addressing), for example. The LBA is a logical address having attached thereto a serial number from 0 with respect to sectors.

FIG. 2 illustrates the lookup table 11 (21). The lookup table 11 is a table for managing lookup information for translating a logical address specified by a host (for example, an LBA) to a physical address in the NAND 10 (hereinafter, "NAND address"). The lookup table 11 can be configured to directly translate the logical address to the NAND address, or can be configured to perform two-stage address translation. For example, when two-stage address translation is performed, a first table (a table pointer) for converting the logical address to storage position information of the lookup address translation table is prepared, and a second table for converting the logical address to the NAND address is prepared at a position on the NAND 10 indicated by the first table. The lookup table 11 is used mainly at the time of reading data from the NAND 10.

FIG. 3 illustrates the reverse lookup table 12 (22). The reverse lookup table 12 is a table for managing reverse lookup information for translating a NAND address to a logical address (for example, an LBA). The reverse lookup table 12 can be configured to directly convert the NAND address to the logical address, or can be configured to perform two-stage address translation. For example, when two-stage address translation is performed, a third table (a table pointer) for converting the NAND address to storage position information of the reverse-lookup address translation table is prepared, and a fourth table for converting the NAND address to the logical address is prepared at a position on the NAND 10 indicated by the third table. The reverse lookup table 12 (22) is used mainly at the time of performing compaction of the NAND 10.

While the reverse lookup table 12 (22) can have a validity flag indicating whether corresponding data is valid or invalid, in this case, frequent update of the validity flag occurs on the NAND 10. As a result, loading from the NAND 10 to the memory 20 and storing of data from the memory 20 to the NAND 10 occur frequently. Therefore, the reverse lookup information does not include the validity flag and only includes an LBA. Accordingly, as described later, valid-invalid determination of data is performed by collating the reverse lookup table and the lookup table with each other.

Figure 4:
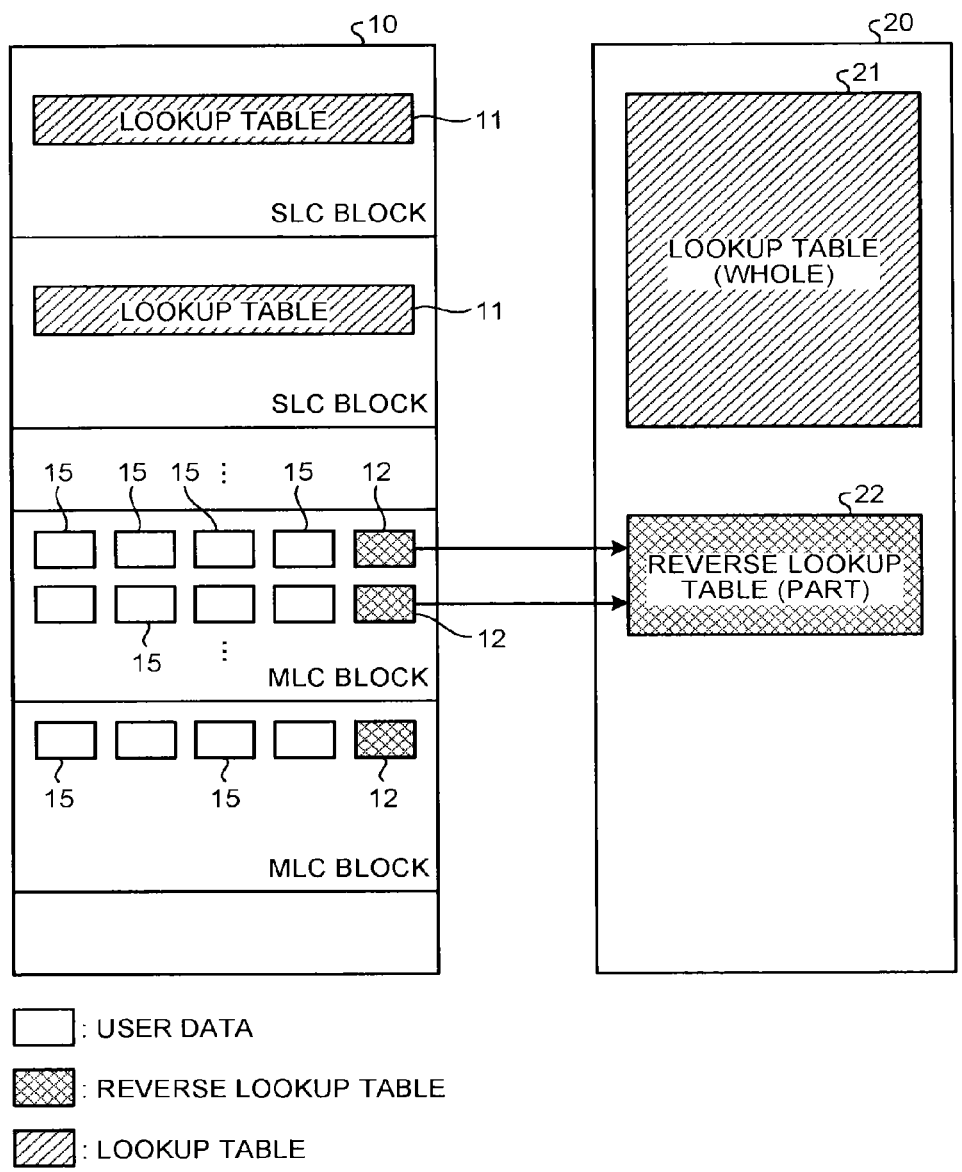
FIG. 4 illustrates an example of a storage method of a lookup address translation table and a reverse-lookup address translation table in a NAND and a memory.

The reverse lookup table 12 can be stored in a block reserved exclusively for the table in the NAND 10 or can be stored in a block where user data is stored. FIG. 4 illustrates an example where the reverse lookup table 12 is stored in a block same as that having user data stored therein.

In the present embodiment, as shown in FIG. 4, the lookup table 11 is stored in a block in which recording is performed in an SLC (Single Level Cell) mode, and the reverse lookup table 12 is stored in a block in which recording together with user data is performed in an MLC (Multi Level Cell) mode. In the SLC mode, 1 bit is recorded in one memory cell, whereas in the MLC mode, N bits (N>1) can be recorded in one cell. The recording in the MLC mode has a merit such that the memory capacity per memory cell can be increased more than that in the recording in the SLC mode. On the other hand, the recording in the SLC mode has a merit such that the write and read access time is shorter and its reliability is higher as compared to the recording in the MLC mode. In the present embodiment, the lookup table 11 is stored in a block that performs recording in the SLC mode and the reverse lookup table 12 is stored in a block that performs recording in the MLC mode. Therefore, the reverse lookup table 12 has a higher possibility of a read error than the lookup table 11.

In the present embodiment, as shown in FIG. 4, all the pieces of information in the lookup table 11 are loaded in the memory 20. When two-stage lookup address translation is performed, the first table (a table pointer) including table pointer information for all the pieces of user data is loaded to the memory 20. Meanwhile, only a part of the information in the reverse-lookup address translation table 12 is loaded in the memory 20. Therefore, usage of the memory 20 related to the reverse-lookup address translation table can be reduced. In the present embodiment, the reverse-lookup address translation table 12 is stored in the same block as the user data 15. For example, the reverse lookup table 12 related to the user data stored in the same page is written in the same page. Therefore, at the time of compaction, when the user data in the compaction source block is loaded from the NAND 10 to the memory 20, the reverse lookup table 12 related to the user data in the compaction source block is also loaded to the memory 20.

In FIG. 1, the controller 3 includes a read control unit 31, a write control unit 32, and a compaction control unit 33.

Upon input of a read command and an LBA as a read address from the host 1, the read control unit 31 refers to the lookup table 21 to load data corresponding to the LBA from the NAND 10 to the buffer memory 25, and transmits the loaded data to the host 1.

Upon input of a write command, an LBA as a write address, and write data, the write control unit 34 writes data specified by the LBA in the buffer memory 25. When a free space is insufficient in the buffer memory 25, the write control unit 34 flushes data from the buffer memory 25 and stores the flushed data in the NAND 10.

The blocks in the NAND 10 are classified into an active block currently being used and an unused free block. For example, when data of the same LBA is overwritten, the following process is performed. It is assumed in this process that valid data having a block size is stored at a logical address A1, and a block B1 is used as a memory area. When a command to overwrite update data having a block size at the logical address A1 is received from the host 1, one free block (referred to as "block B2") is secured, and data received from the host 1 is written in the free block. Thereafter, the logical address A1 and the block B2 are associated with each other. As a result, because the block B2 becomes the active block and the data stored in the block B1 becomes invalid, the block B1 becomes the free block.

As described above, in the memory system 100, even if the data is at the same logical address A1, the block to be used as an actual storing area changes for each write. At the time of write of update data having the block size, a write destination block changes inevitably. However, at the time of write of update data having a size smaller than the block size, the update data may be written in the same block. For example, when page data having a size smaller than the block size is updated, old page data having the same logical address in the block is invalidated, and the newly written latest page data is managed as a valid page. When all the pieces of data in the block are invalidated, the block is released as the free block.

The compaction control unit 33 performs compaction in the NAND 10. When write to the NAND 10 is repeated, the number of unused blocks is gradually reduced, and the unused blocks become insufficient at some point in time. Furthermore, by repeatedly performing writing, a block in which valid data and invalid data are present together or a block including only invalid data is generated. Therefore, compaction is performed by collecting pieces of valid data from a plurality of compaction source blocks so as to relocate the collected data to a compaction destination block.

At the time of performing compaction, the compaction control unit 33 loads the reverse lookup table 12 corresponding to the data in the compaction source block from the NAND 10 to the memory 20, in order to determine whether the data in the compaction source block is valid or invalid. When loading of the reverse lookup table is successful, the compaction control unit 33 collates the lookup table 21 on the memory 20 with the loaded reverse lookup table 22. When a collation result is a match, the compaction control unit 33 determines that the data is valid, and when the collation result is not a match, the compaction control unit 33 determines that the data is invalid.

Furthermore, at the time of determining whether the data in the compaction source block is valid or invalid, when loading of the reverse lookup table 12 from the NAND 10 to the memory 20 has failed, the compaction control unit 33 searches all the entries in the lookup table 21 on the memory 6 until a valid entry indicating a NAND address to be determined is found. When the valid entry indicating a NAND address to be determined is found in the lookup table 21 on the memory 6, the compaction control unit 33 determines that the data corresponding to the NAND address to be determined is valid, and when the valid entry is not found, the compaction control unit 33 determines that the data is invalid.

Figure 5:
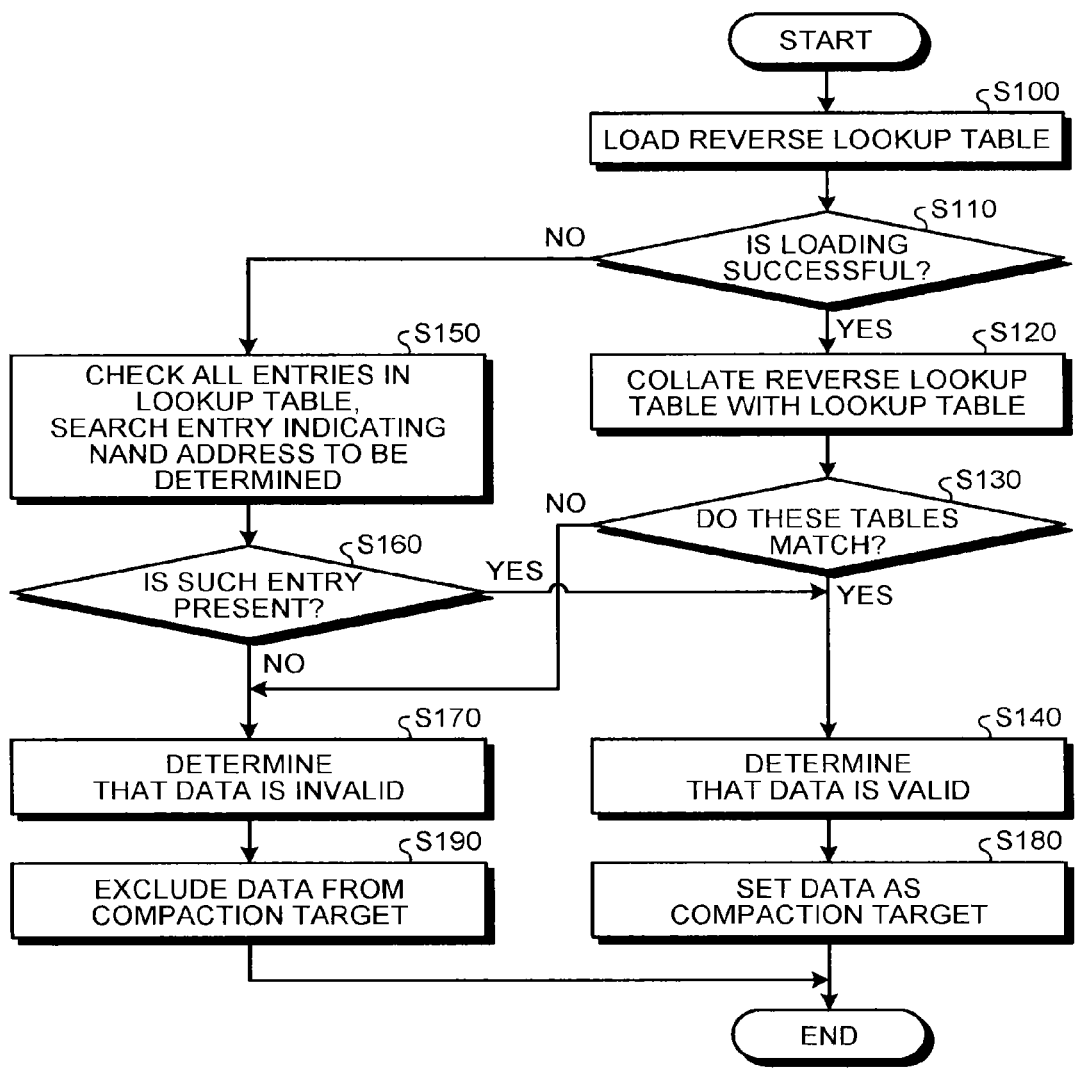
FIG. 5 is a flowchart illustrating an example of a data validity determination process at a time of compaction.

A data validity determination process at the time of compaction performed by the compaction control unit 33 is explained next with reference to the flowchart shown in FIG. 5. The compaction control unit 33 selects a compaction source block from the NAND 10, and loads the reverse lookup table 12 related to the data in the block from the NAND 10 to the memory 20 (Step S100). In the present embodiment, as shown in FIG. 4, because the reverse lookup table 12 is stored in a block same as that having the data stored therein, the reverse lookup table 12 is loaded together with the data at the time of reading the data.

When a decoding process in the ECC circuit 5 is successful, and the reverse lookup table 12 can be loaded from the NAND 10 to the memory 20 (Yes at Step S110), the compaction control unit 33 collates the loaded reverse lookup table 22 with the lookup table 21 on the memory 20 (Step S120).

Figure 6:
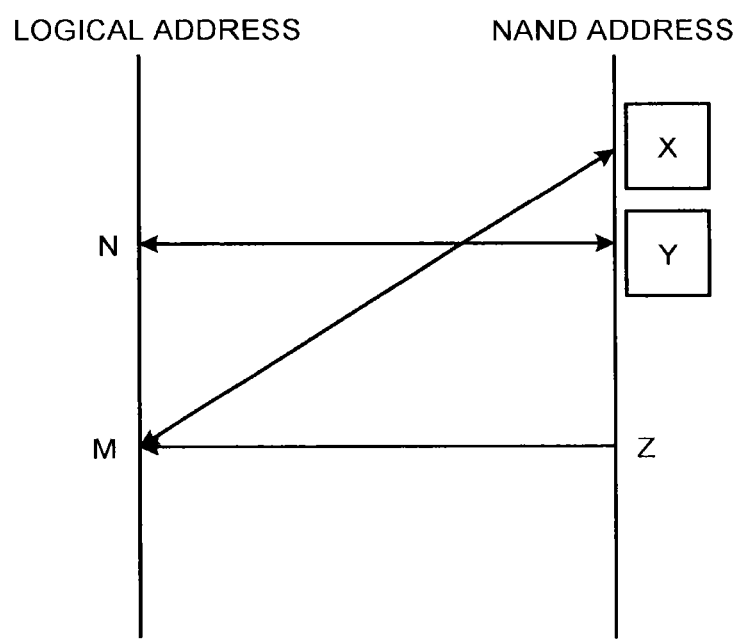
FIG. 6 illustrates an example of a logical address and a physical address.

When the contents of the lookup table 21 shown in FIG. 2 and the contents of the reverse lookup table 22 shown in FIG. 3 are mapped, a result shown in FIG. 6 is obtained. As shown in FIG. 3, there are an entry of "NAND address X—logical address M", an entry of "NAND address Y—logical address N", and an entry of "NAND address Z—logical address M" in the reverse lookup table 22. Meanwhile, as shown in FIG. 2, there are entries such as an entry of "logical address N—NAND address Y" and an entry of "logical address M—NAND address X" in the lookup table 21. Therefore, when both tables 21 and 22 are collated with each other, pieces of data at NAND addresses X and Y are determined to be valid, and data at the NAND address Z is determined to be invalid. In FIG. 6, data determined to be valid is indicated by a double-way arrow, and data determined to be invalid is indicated by a one-way arrow.

In the collation process at Step S120, when a valid entry matching reverse lookup information of compaction source data is present in the lookup table 21 (Yes at Step S130), the compaction control unit 33 determines that the compaction source data is valid (Step S140), and sets the compaction source data as data to be compacted (Step S180). Meanwhile, in the collation process at Step S120, when a valid entry matching the reverse lookup information of the compaction source data is not present in the lookup table 21 (No at Step S130), the compaction control unit 33 determines that the compaction source data is invalid (Step S170), and excludes the compaction source data from data to be compacted (Step S190).

At Step S110, when the decoding process has failed in the ECC circuit 5 and a read error occurs, loading of the reverse lookup table 12 from the NAND 10 to the memory 20 fails (No at Step S110). In this case, the compaction control unit 33 searches all the entries of the lookup table 21 for a NAND address. That is, the compaction control unit 33 determines whether a valid entry indicating a NAND address of data in the compaction source block to be determined as valid or invalid is present in the lookup table 21 (Steps S150 and S160). When a valid entry is present, the compaction control unit 33 determines that the compaction source data is valid (Step S140), and sets the compaction source data as data to be compacted (Step S180). In the determination at Step S160, when a valid entry indicating a NAND address of the compaction source data is not present in the lookup table 21 (No at Step S160), the compaction control unit 33 determines that the compaction source data is invalid (Step S170), and excludes the compaction source data from data to be compacted (Step S190).

For example, it is assumed that lookup information shown in FIGS. 2 and reverse lookup information shown in FIGS. 3 are registered. The compaction control unit 33 attempts to load the entry of "NAND address X—logical address M" shown in FIG. 3, in order to determine whether the reverse lookup information of the NAND address X is valid or invalid. When the loading fails, the compaction control unit 33 determines whether the NAND address X being an address to be determined is present in the lookup table 21. In this case, because there is an entry indicating the lookup information having the NAND address X in the lookup table 21, the compaction control unit 33 determines that the data having the NAND address X is valid.

Meanwhile, in order to determine the validity of the reverse lookup information of the NAND address Z, the compaction control unit 33 attempts to load the entry of NAND address Z—logical address M shown in FIG. 3. When the loading has failed, the compaction control unit 33 determines whether the NAND address Z being an address to be determined is present in the lookup table 21. In this case, because there is no entry indicating the lookup information having the NAND address Z in the lookup table 21, the compaction control unit 33 determines that the data having the NAND address Z is invalid.

As described above, according to the present embodiment, when a read error of the NAND 10 occurs and the reverse lookup information of the compaction source data cannot be acquired, all the entries in the lookup tables 21 are checked to determine the validity of the compaction source data. On the other hand, when data corresponding to the reverse lookup information in which a read error occurs is simply determined to be invalid, the data corresponding to the reverse lookup information in which a read error has occurred is eventually erased at the time block erasure. Therefore, when there is a read request of the data from the host 1, an error is returned to the host 1. On the other hand, according to the present embodiment, all the entries in the lookup tables 21 are checked to determine the validity of data, and thus reliability as a storage device can be improved.

When a block that stores therein user data and a block that stores therein a lookup table or a reverse lookup table are different blocks, compaction also occurs to the block that stores therein user data. At the time of compaction of the block that stores therein these tables, by collating the lookup table and the reverse lookup table with each other, the validity of lookup information and reverse lookup information can be determined. Subsequently, when a read error of the reverse lookup information occurs, all the entries in the lookup information are checked to determine the validity of the reverse lookup information in which a read error has occurred.

What is claimed is:

1. A memory system comprising:
    a nonvolatile first memory including a plurality of blocks as a unit of data erasing;
    a second memory that is randomly accessible; and
    a controller that performs data transfer between a host device and the first memory via the second memory, wherein
    the first memory stores therein
    a first address translation table for managing lookup information that associates a logical address specified by the host device with a physical address in the first memory, and
    a second address translation table for managing reverse lookup information that associates the physical address in the first memory with the logical address, wherein
    the controller is configured to, when loading of the reverse lookup information from the first memory to the second memory has failed, determine whether data at a first physical address is valid or invalid by using the lookup information loaded from the first memory to the second memory.

2. The memory system according to claim 1, wherein the controller is configured to
    check all pieces of lookup information registered in the first address translation table by using the lookup information loaded from the first memory to the second memory,
    when lookup information including the first physical address has been registered therein, determine that data at the first physical address is valid, and
    when lookup information including the first physical address has not been registered therein, determine that the data at the first physical address is invalid.

3. The memory system according to claim 2, wherein
    the first memory includes a plurality of first blocks in which data is written in a first mode, and a plurality of second blocks in which data is written in a second mode, the second mode has a memory capacity per memory cell larger than that of the first mode, and
    the controller is configured to store the first address translation table in the first block and to store the second address translation table in the second block.

4. The memory system according to claim 2, wherein when the loading of the reverse lookup information is successful, the controller is configured to
    obtain a first logical address corresponding to the first physical address by using the loaded reverse lookup information,
    obtain a second physical address corresponding to a second logical address by using the lookup information loaded from the first memory to the second memory,
    when the first physical address matches the second physical address, determine that data at the first physical address is valid, and
    when the first physical address does not match the second physical address, determine that data at the first physical address is invalid.

5. The memory system according to claim 4, wherein the controller is configured to
    select a block as a compaction source from the first memory, and
    determine whether data stored in the selected block is valid or invalid by using the loaded reverse lookup information.

6. The memory system according to claim 5, wherein the controller sets data determined to be valid as compaction target data, and excludes data determined to be invalid from the compaction target data.

7. The memory system according to claim 2, wherein the controller selects a block as a compaction source from the first memory and sets a physical address corresponding to a selected block as the first physical address.

8. The memory system according to claim 1, wherein
    pointing information is stored in the first memory, the pointing information indicating a storage position of the reverse lookup information in the second address translation table, and
    the controller loads a part of the reverse lookup information to the second memory based on the pointing information.

9. The memory system according to claim 1, further comprising a correction unit that performs an error correction process of data read from the first memory, wherein
    at a time of the loading of the reverse lookup information, when the correction unit cannot correct an error in the loaded reverse lookup information, the controller determines that the loading of the reverse lookup information has failed.

10. A control method of a memory system, wherein
    the memory system includes
    a nonvolatile first memory including a plurality of blocks as a unit of data erasing, and
    a second memory that is randomly accessible, and
    the method comprises:
    storing, in the first memory, a first address translation table for managing lookup information that associates a logical address specified by a host device with a physical address in the first memory, and a second address translation table for managing reverse lookup information that associates a physical address in the first memory with the logical address; and
    when loading of the reverse lookup information from the first memory to the second memory has failed, determining whether data at a first physical address is valid or invalid by using the lookup information loaded from the first memory to the second memory.

11. The control method according to claim 10, further comprising
    checking all pieces of lookup information registered in the first address translation table by using the lookup information loaded from the first memory to the second memory,
    when lookup information including the first physical address has been registered, determining that data at the first physical address is valid, and when lookup information including the first physical address has not been registered, determining that the data at the first physical address is invalid.

12. The control method according to claim 11, wherein
the first memory includes a plurality of first blocks in which data is written in a first mode, and a plurality of second blocks in which data is written in a second mode, the second mode has a memory capacity per memory cell larger than that of the first mode, and
the method further comprising:
storing the first address translation table in the first block; and
storing the second address translation table in the second block.

13. The control method according to claim 11, further comprising:
obtaining a first logical address corresponding to the first physical address by using the loaded reverse lookup information when the loading of the reverse lookup information is successful;
obtaining a second physical address corresponding to a second logical address by using the lookup information loaded from the first memory to the second memory; and
when the first physical address matches the second physical address, determining that data at the first physical address is valid, and when the first physical address does not match the second physical address, determining that data at the first physical address is invalid.

14. The control method according to claim 13, further comprising:
selecting a block as a compaction source from the first memory; and
determining whether data stored in the selected block is valid or invalid by using the loaded reverse lookup information.

15. The control method according to claim 14, further comprising setting data determined to be valid as compaction target data, and excludes data determined to be invalid from the compaction target data.

16. The control method according to claim 11, further comprising selecting a block as a compaction source from the first memory and setting a physical address corresponding to a selected block as the first physical address.

17. The control method according to claim 10, further comprising:
storing pointing information in the first memory, the pointing information indicating a storage position of the reverse lookup information in the second address translation table; and
loading a part of the reverse lookup information to the second memory based on the pointing information.

18. The control method according to claim 10, further comprising:
performing an error correction process of data read from the first memory; and
at a time of the loading the reverse lookup information, when an error in the loaded reverse lookup information cannot be corrected by the error correction process, determining that the loading of the reverse lookup information has failed.

* * * * *